United States Patent
Nagy et al.

(10) Patent No.: US 10,962,389 B2
(45) Date of Patent: Mar. 30, 2021

(54) MACHINE STATUS DETECTION

(71) Applicant: INTERNATIONAL BUSINESS MACHINES CORPORATION, Armonk, NY (US)

(72) Inventors: Alexandru Z. Nagy, Gilroy, CA (US); David Monczynski, San Jose, CA (US); Kaoru Stabnow, Colorado Springs, CO (US); Jimmy Y Wong, Saratoga, CA (US); Ingrid Lawrendra, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 16/150,336

(22) Filed: Oct. 3, 2018

(65) Prior Publication Data
US 2020/0110686 A1 Apr. 9, 2020

(51) Int. Cl.
*G06F 11/00* (2006.01)
*G01D 11/24* (2006.01)
(Continued)

(52) U.S. Cl.
CPC ........ *G01D 11/245* (2013.01); *G06F 11/3044* (2013.01); *H05K 7/1488* (2013.01);
(Continued)

(58) Field of Classification Search
CPC ......... G11B 33/02; G11B 33/06; G11B 33/12; G11B 33/123; G11B 33/127; G06F 1/181; G06F 1/182; G06F 11/3044; G06F 11/3089; G06F 11/3093; G06F 1/16; G06F 1/1684; G06F 1/1686; G06F 1/183–1/188; H05K 5/0247; H05K 7/14; H05K 7/1485–1498; H05K 7/18–186; G05J 5/04; G05J 5/041; G05J 5/047; G05J 1/0403; G05J 2003/062; G05J 2003/063; G01K 1/146; G01D 11/245; G01D 11/30; G01D 11/305
See application file for complete search history.

(56) References Cited

U.S. PATENT DOCUMENTS 7,436,303 B2 10/2008 Tourrilhes
8,223,015 B2 7/2012 Yuuki
(Continued)

OTHER PUBLICATIONS

Zhang, "CENet: A cabinet environmental sensing network." Sensors 2010, 10(2), pp. 1021-1040.

*Primary Examiner* — Marc Duncan
(74) *Attorney, Agent, or Firm* — Tihon Poltavets (57) ABSTRACT

An apparatus for attachable sensory assembly includes a plurality of gear tracks, a sensory device, a first structure, and a second structure. The sensory device is suspended by the first structure and the second structure, where the sensory device is moveable along a length of the first structure and a length of the second structure. A first end and a second end of the first structure are each disposed on a first portion of the plurality of gear tracks, where the first portion of the plurality of gear tracks guide the first end and the second end of the first structure. A first end and a second end of the second structure are each disposed on a second portion the plurality of gear tracks, where the second portion of the plurality of gear tracks guide the first end and the second end of the second structure.

17 Claims, 7 Drawing Sheets

(51) Int. Cl.
  *G06F 11/30* (2006.01)
  *H05K 7/14* (2006.01)
  *G06F 11/32* (2006.01)

(52) U.S. Cl.
  CPC ........ *H05K 7/1498* (2013.01); *G06F 11/3065* (2013.01); *G06F 11/324* (2013.01)

(56) References Cited

U.S. PATENT DOCUMENTS

| | | |
|---|---|---|
| 9,347,834 B2 | 5/2016 | Adriaenssens |
| 9,418,256 B2 | 8/2016 | Nordin |
| 9,843,847 B2 * | 12/2017 | Lewis ................. H04Q 9/00 |
| 9,959,189 B2 | 5/2018 | Katou |
| 9,977,722 B2 | 5/2018 | Hsieh |
| 2007/0187343 A1 | 8/2007 | Colucci et al. |
| 2011/0084839 A1 | 4/2011 | Groth et al. |
| 2013/0169816 A1 | 7/2013 | Hu |
| 2015/0123562 A1 | 5/2015 | Adriaenssens et al. |
| 2019/0062053 A1 * | 2/2019 | Jensen ................. G06F 11/00 |
| 2019/0163599 A1 * | 5/2019 | Breuer ............. G06F 11/3058 |

* cited by examiner

MACHINE STATUS DETECTION

FIELD OF THE INVENTION

This disclosure relates generally to machine status detection, and in particular, to monitoring machine status on a computer server rack.

BACKGROUND OF THE INVENTION

A machine rack, or server rack, typically includes various electrical equipment and components configurable according to customer requirements. Each machine rack is unique due to the numerous combinations of electrical equipment and mounting options possible when meeting each specific customer requirement. Visual and audible monitoring of the various equipment on the machine rack is typically manually performed by an administrative user, where the administrative user is located onsite and requires physical access to the machine rack to perform the visual and audible monitoring to register readings. The administrative user may not always be available to perform the visual and audible monitoring to register readings during critical events (e.g., machine failure or error) that require immediate action to prevent additional damage to the electronic equipment.

SUMMARY

One aspect of an embodiment of the present invention discloses an apparatus for an attachable sensory assembly, the apparatus comprising a plurality of gear tracks, a sensory device, a first structure, and a second structure. The sensory device is suspended by the first structure and the second structure, wherein the sensory device is moveable along a length of the first structure and a length of the second structure. A first end and a second end of the first structure are each disposed on a first portion of the plurality of gear tracks, wherein the first portion of the plurality of gear tracks guide the first end and the second end of the first structure. A first end and a second end of the second structure are each disposed on a second portion the plurality of gear tracks, wherein the second portion of the plurality of gear tracks guide the first end and the second end of the second structure.

A second aspect of an embodiment of the present invention discloses a method comprising scanning, by a sensory device of a machine status detection system, one or more machines present in a configuration of a machine rack based on a created scan plan. Responsive to detecting a triggering event, scanning, by the sensory device of the machine status detection system, a problematic machine that caused the triggering event. Comparing, by one or more processors, scan results of the problematic machine to stored scan results of the problematic machine for registered reading deviations between the scan result of the problematic machine and the stored results of the problematic machine. Generating, by one or more processors, a report based on the comparison.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments of the present invention provide a machine status detection system that includes a set of gear tracks or rail system that allows for the movement of a sensory device for monitoring one or more machines, where the sensory device is capable of registering readings at various intervals for the one or more machines for comparison to previously established base measurements. The apparatus is mountable to any surface of a machine rack housing the one or more machines, where a perimeter established by the set of gear tracks defines an area where the sensory device registers readings for the one or more machines. An example of one or more sensors of the sensory device include but are not limit to, visible light still camera, infrared still camera, infrared video camera, temperature detection, smoke detection, and audio detection. The sensory device scans a select group or all machines for status discrepancies as compared to the previously established base measurements. Scans are triggered by a machine failure, a machine error, or an alarm generated by a machine. Additionally, scans can be established to run on scheduled intervals or manually initialized by an administrative user of the sensory device. Responsive to identifying deviations or discrepancies from the previously established base measurements, a report with various data logs and pertinent information is sent to the administrative user.

Embodiments of the present invention provide a computer program for utilizing the machine status detection system that includes a setup phase for the sensory device and an analysis phase for the sensory device. The setup phase includes configuring the machine status detection system and scanning the one or more machines present in the configuration on the machine rack. The scanned results of the one or more machines are stored as base measurements to which future registered readings are compared to when identifying deviations or discrepancies. Hot-zone subareas in the configuration are identified in the scanned area that require additional monitoring by the sensory device and based on the configuration, base measurements, and hot-zone subareas, a scan plan is created for the machine status detection system. The analysis phase includes scanning machines present in the configuration based on the created scan plan and determining whether a trigger has been detected. Responsive to the trigger being detected (e.g., machine failure or machine error), the problematic machine is scanned and the registered readings are collected. The registered readings from the problematic machine are compared to the stored base measurements and any deviations or discrepancies are identified between the two readings. A report is generated based on the comparison with various data logs, permanent information, and list of deviations or discrepancies between the two readings.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 1:
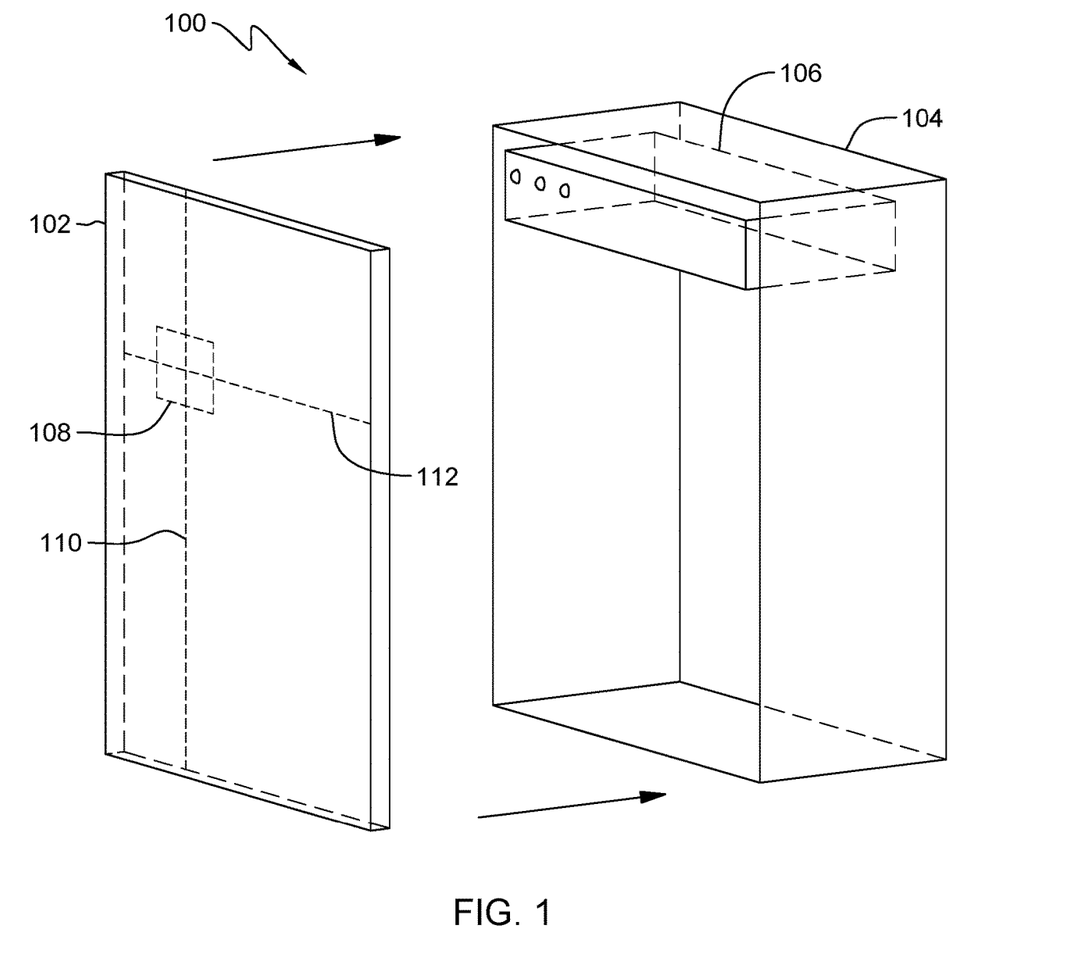
FIG. 1 depicts an attachable sensory assembly decoupled from a server rack, in accordance with an embodiment of the present invention.

FIG. 1 depicts an attachable sensory assembly decoupled from a server rack, in accordance with an embodiment of the present invention.

In this embodiment, decoupled attachable sensory assembly 100 includes attachable sensory assembly 102 decoupled from server rack 104, where attachable sensory assembly 102 is mountable to any exterior surface (i.e., side, top, or bottom) on server rack 104. A height and width of attachable sensory assembly 102 is configurable based on a height and width of the exterior surface on server rack 104 to which attachable sensory assembly 102 is mounted. Server rack 104 includes various electrical equipment, such as machine 106, where the various electrical equipment is capable of relaying operational information in an audible or visual manner. Machine 106 can relay audible operational information utilizing various tones and combination of tones which correlate to a specific status of machine 106. Machine can relay visual operational information utilizing a combination of LEDs and display screens (e.g., LCD) to display specific statuses of machine 106.

Attachable sensory assembly 102 includes sensory device 108 mounted to longitudinal structure 110 and latitudinal structure 112. Sensory device 108 includes one or more sensors for capturing information emitted, transmitted, or conveyed by the electrical equipment (e.g., machine 106) of server rack 104. The one or more sensors can include a light sensor, a sound sensor, a proximity sensor, an accelerometer, an infrared sensor, a pressure sensor, an ultrasonic sensor, a smoke sensor, a temperature sensor, or any other electronic sensor known in the art for capturing information. Longitudinal structure 110 and latitudinal structure 112 provide structural support for sensory device 108 suspended in attachable sensory assembly 102, while allowing for movement of sensory device 108 across an area of attachable sensory assembly 102 opposite server rack 104. Longitudinal structure 110 allows for sensory device 108 to move in the y-axis direction on attachable sensory assembly 102 and latitudinal structure 112 allows for sensory device 108 to move in the x-axis direction on attachable sensory assembly 102. Attachable sensory assembly 102, sensory device 108, longitudinal structure 110, and latitudinal structure 112 are discussed in further detail with regards to FIG. 3.

Figure 2:
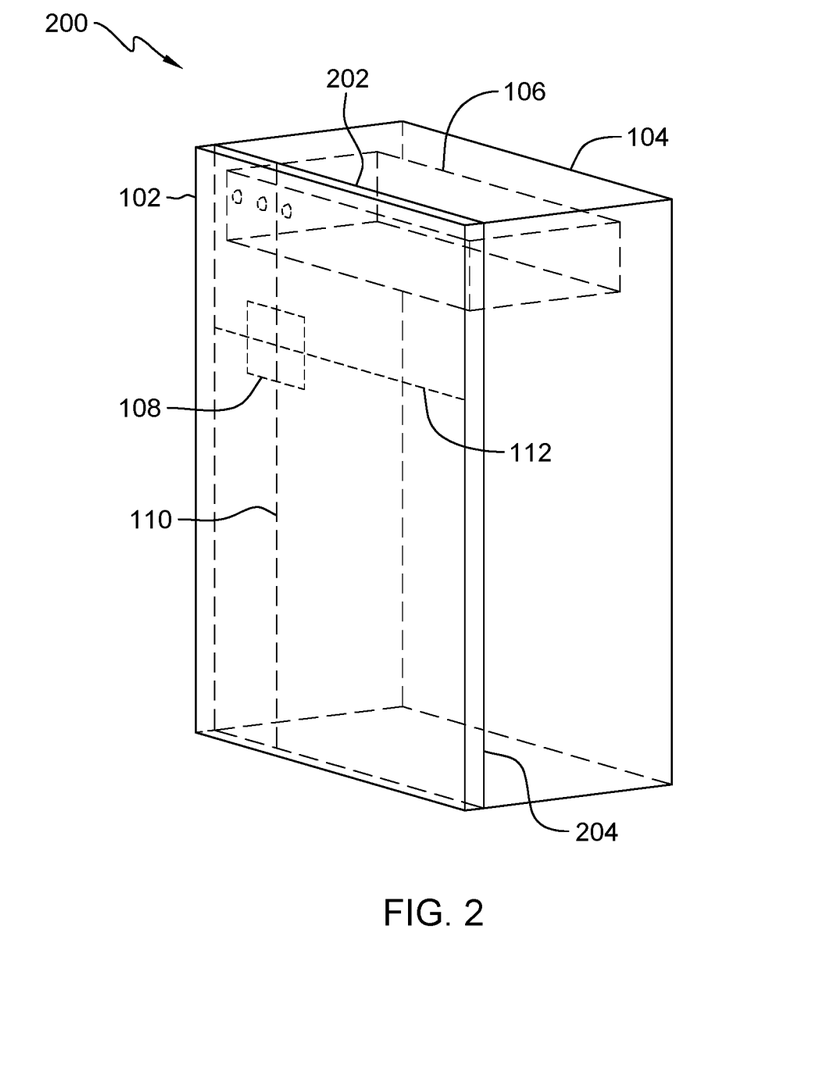
FIG. 2 depicts the attachable sensory assembly coupled to the server rack, in accordance with an embodiment of the present invention.

FIG. 2 depicts the attachable sensory assembly coupled to the server rack, in accordance with an embodiment of the present invention. In this embodiment, coupled attachable sensory assembly 200 includes attachable sensory assembly 102 coupled to a surface of server rack 104, where an area of coverage of attachable sensory assembly 102 with sensory device 108 is at least equal to an area of the surface of server rack 104 to which attachable sensory assembly 102 is coupled. As a result, sensory device 108 can utilize longitudinal structure 110 and latitudinal structure 112 to access any point on the surface of the server rack. Attachable sensory assembly 102 is coupled to server rack 104 utilizing one or more fasteners along a perimeter of both attachable sensory assembly 102 and server rack 104, such that the one or more fasteners do not interfere with the operation of sensory device 108 on attachable sensory assembly 102. In this embodiment, attachable sensory assembly 102 aligns with server rack 104 along latitudinal edge 202 and latitudinal edge 204. Attachable sensory assembly 102 is configurable to any shape or size, where attachable sensory assembly 102 can couple to server rack 104 at various points on a mounting surface. For example, if attachable sensory assembly 102 is to monitor only machine 106 in server rack 104, attachable sensory assembly 102 is configured to mount to a surface opposite machine 106, where the dimensions of attachable sensory assembly 102 are less than those illustrated in FIG. 2.

In one embodiment, an interface material is disposed between a coupling surface of attachable sensory assembly 102 and a coupling surface of server rack 104 to prevent any electronic interference and to dampen any vibrations due to operational movements of sensory device 108. In another embodiment, a void is present between a coupling surface of attachable sensory assembly 102 and a coupling surface of sever rack 104 to prevent the translation of vibrations to server rack 104 due to operational movements of sensory device 108. The void also allows for clearance of any cables or electronic equipment that extend outside the bounds of server rack 104.

Figure 3:
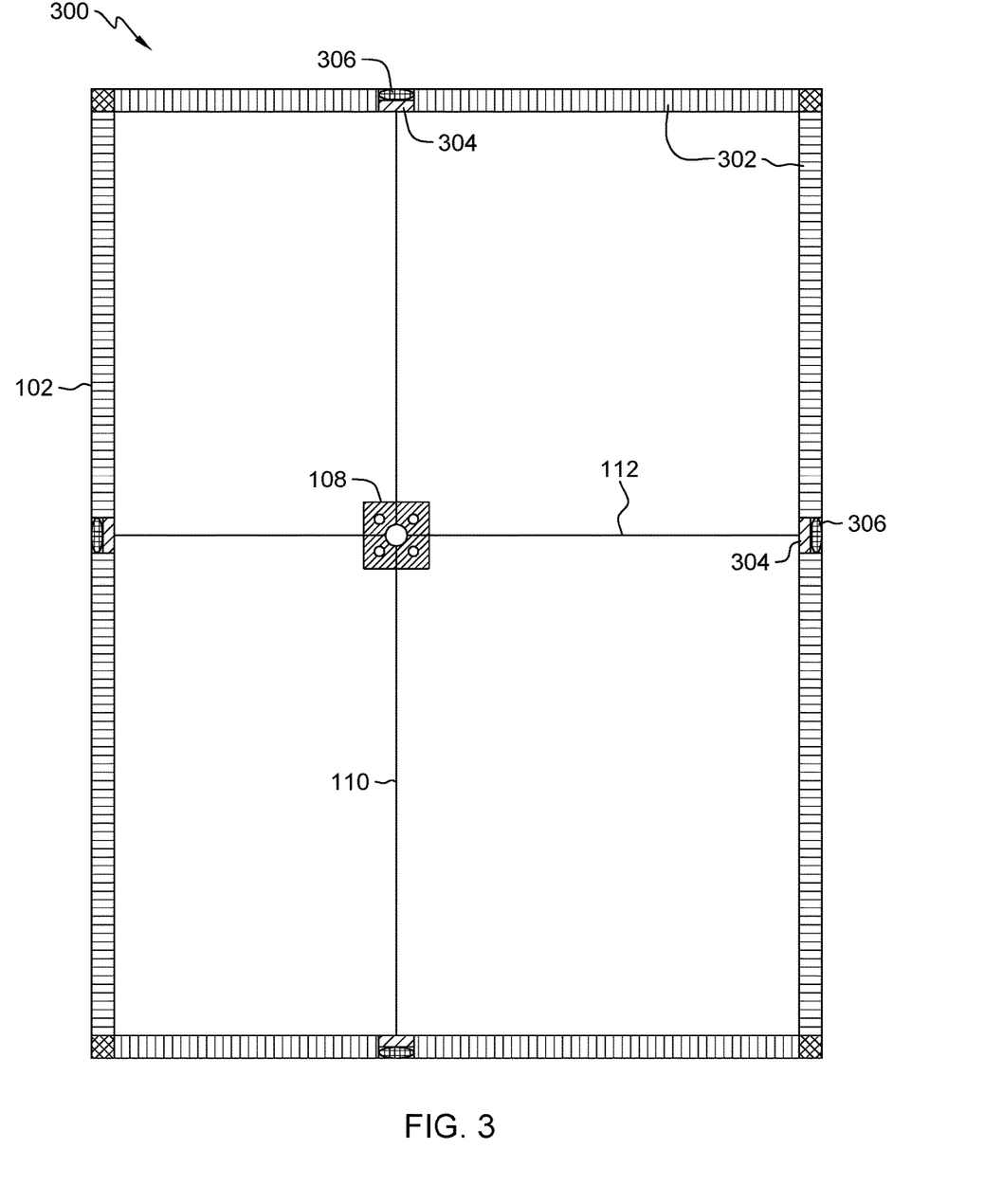
FIG. 3 depicts a detailed view of the attachable sensory assembly, in accordance with one embodiment of the present invention.

FIG. 3 depicts a detailed view of the attachable sensory assembly, in accordance with one embodiment of the present invention. In this embodiment, removed attachable sensory assembly 300 includes attachable sensory assembly 102 with sensory device 108 suspended via longitudinal structure 110 and latitudinal structure 112. As previously discussed, the dimension (i.e., height and width) of attachable sensory assembly 102 is dependent on the configuration of server rack 104 and the electrical equipment on server rack 104 which is being monitored by sensory device 108. Attachable sensory assembly 102 includes gear tracks 302 disposed along a perimeter of an area, where sensory device 108 is to monitor electrical equipment within the bounds of the area when coupled to server rack 104. Motor 304 is coupled to gear 306, where a set motor 304 and gear 306 is coupled to each end of both, longitudinal structure 110 and latitudinal structure 112. In another embodiment, a single motor 304 and gear 306 is coupled to at least one end of both, longitudinal structure 110 and latitudinal structure 112. The set of motor 304 and gear 306 coupled to each end of longitudinal structure 110 allows for the x-axis movement of sensory device 108 and the set of motor 304 and gear 306 coupled to each end of latitudinal structure 112 allows for the y-axis movement of sensory device 108.

In this embodiment, longitudinal structure 110 is a first rod and latitudinal structure 112 is a second rod running through a support structure of sensory device 108, where sensory device 108 is suspended in the attachable sensory assembly 102 due to a combination of the support structure, the first rod, and the second rod. In another embodiment, longitudinal structure 110 is a first wire cable and latitudinal structure 112 is a second wire cable running through a support structure of sensory device 108, where sensory device 108 is suspended in the attachable sensory assembly 102 due to a combination of the support structure, the first wire cable, and the second wire cable. The dimensions of attachable sensory assembly 102 are adjustable by removing or adding portions of gear tracks 302 to create a perimeter for covering a desired area of monitoring by sensory device 108. Longitudinal structure 110 and latitudinal structure 112 are adjusted based on the configuration of gear tracks 302, where portions of the first rod and the second rod are removed or added depending on a desired height and width. Alternatively, longitudinal structure 110 and latitudinal structure 112 are adjusted based on the configuration of gear tracks 302, where portions of the first cable wire and the second cable are coiled or uncoiled depending on a desired height and width.

Figure 4:
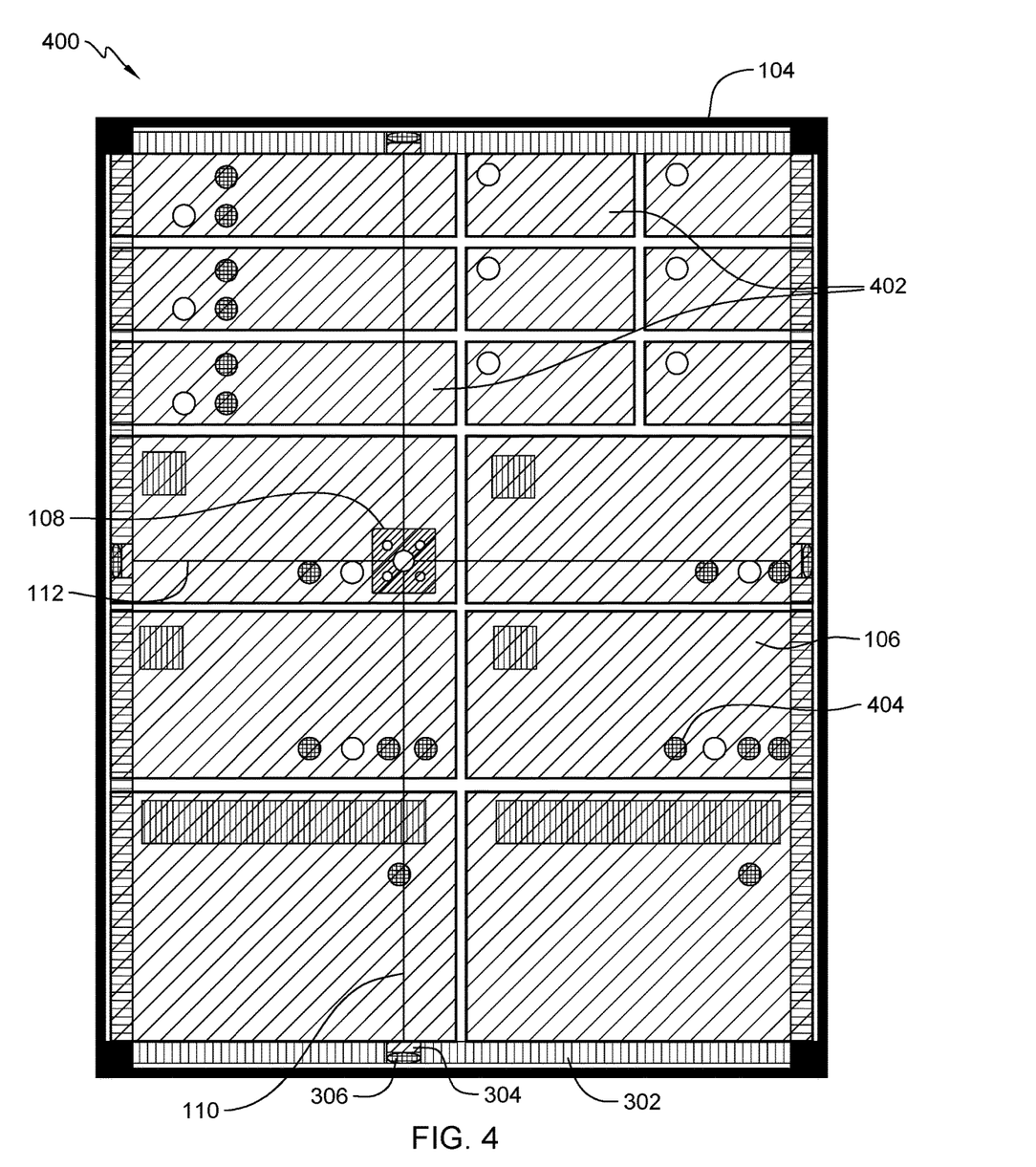
FIG. 4 depicts an example configuration of the attachable sensory assembly coupled to the server rack, in accordance with one embodiment of the present invention.

FIG. 4 depicts an example configuration of the attachable sensory assembly coupled to the server rack, in accordance with one embodiment of the present invention. Scan state configuration 400 includes attachable sensory assembly 102 coupled to server rack 104, where attachable sensory assembly 102 is scanning multiple electrical components 402 located on server rack 104. Machine 106 on server rack 104 represents a single electrical component 402 located on server rack 104. Attachable sensory assembly 102 scans electrical components 402 located within a perimeter created by gear tracks 302, where sensory device 108 scans a single side of electrical components 402 on sever rack 104. The set of motors 304 and gears 306 coupled to each end of both longitudinal structure 110 and latitudinal structure 112 allows for sensory device 108 to move (i.e., scan) in an area defined by the perimeter of gear tracks 302 and store results captured by the one or more sensors of sensory device 108, produced by electrical components 402. Sensory device 108 scans the area defined by the perimeter of gear tracks 302 in a user defined manner, where the user defined manner can be based on a configuration of electrical components 404 on server rack 104.

Status light 404 on machine 106 represents an example of how electrical components 404 can provide visual operational information. Status light 404 can provide various information utilizing a combination of colors and sequential flashing lights to provide operational information. Sensory device 108 can relocate to status light 404 and capture the operational information utilizing the one or more sensors, where a set time interval or unscheduled event prompts sensory 108 to relocate to status light 404.

Figure 5:
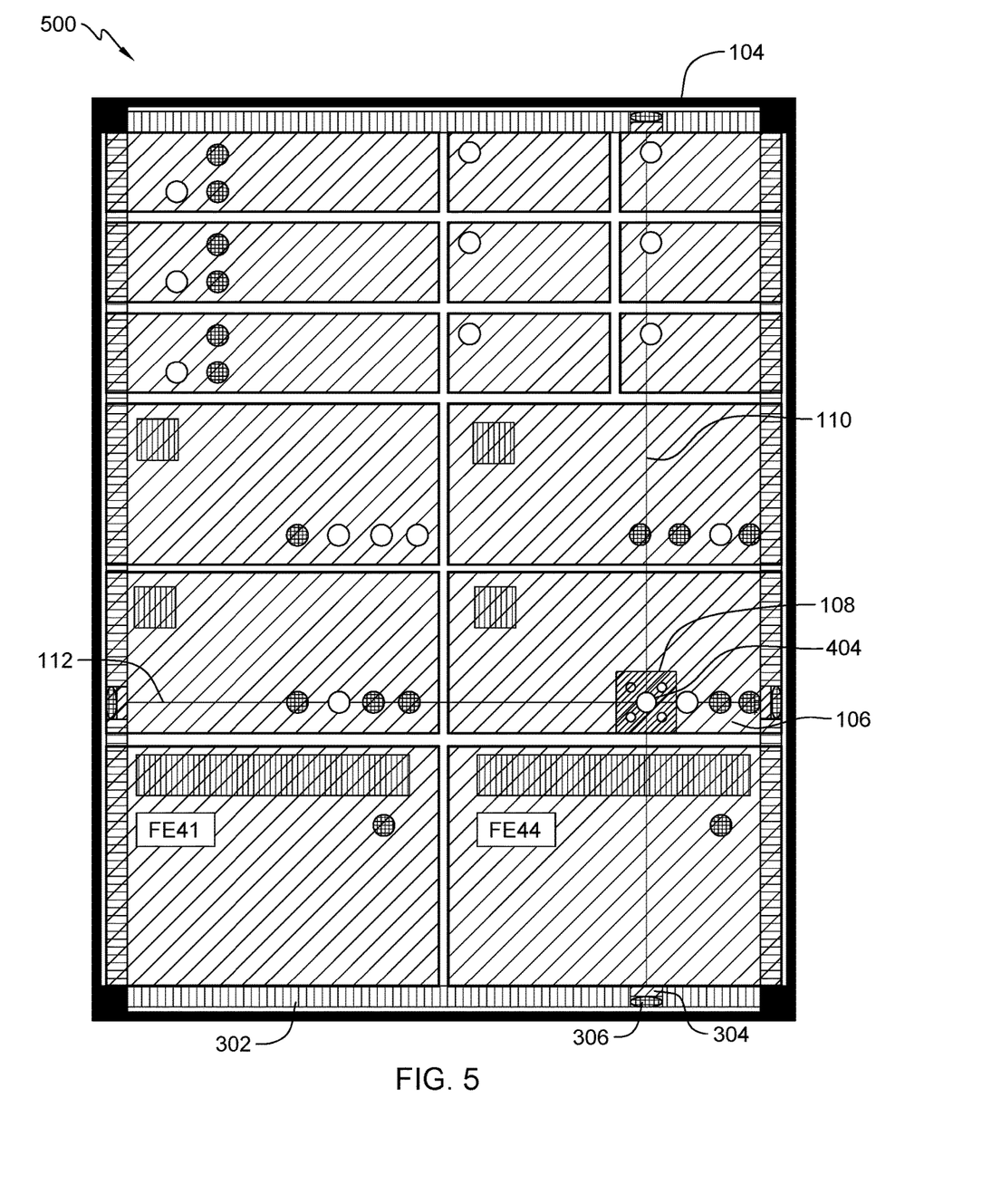
FIG. 5 depicts another example configuration of the attachable sensory assembly coupled to the server rack, in accordance with one embodiment of the present invention.

FIG. 5 depicts another example configuration of the attachable sensory assembly coupled to the server rack, in accordance with one embodiment of the present invention. Prompted state configuration 500 includes attachable sensory assembly 102 coupled to server rack 104 relocating to status light 404 on machine 106 from a previous position during scan state configuration 400, as shown in FIG. 4. Attachable sensory assembly 102 can activate the set of motors 304 and gears 306 coupled to each end of both longitudinal structure 110 and latitudinal structure 112 to relocate sensory device 108 to status light 404 on machine 106. In this embodiment, attachable sensory assembly 102 instructs the set of motors 304 and gears 306 coupled to each end of longitudinal structure 110 to rotate in a counterclockwise direction on gear tracks 304, resulting in sensory device 108 traveling in the −x direction. Attachable sensory assembly 102 instructs the set of motors 304 and gears 306 coupled to each end of latitudinal structure 112 to rotate in a counterclockwise direction on gear tracks 304, resulting in sensory device 108 traveling in the −y direction. The −x and −y directional travel of sensory device 108 allows for the relocation from the previous position, as shown in FIG. 4, to status light 404 on machine 106.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

Figure 6:
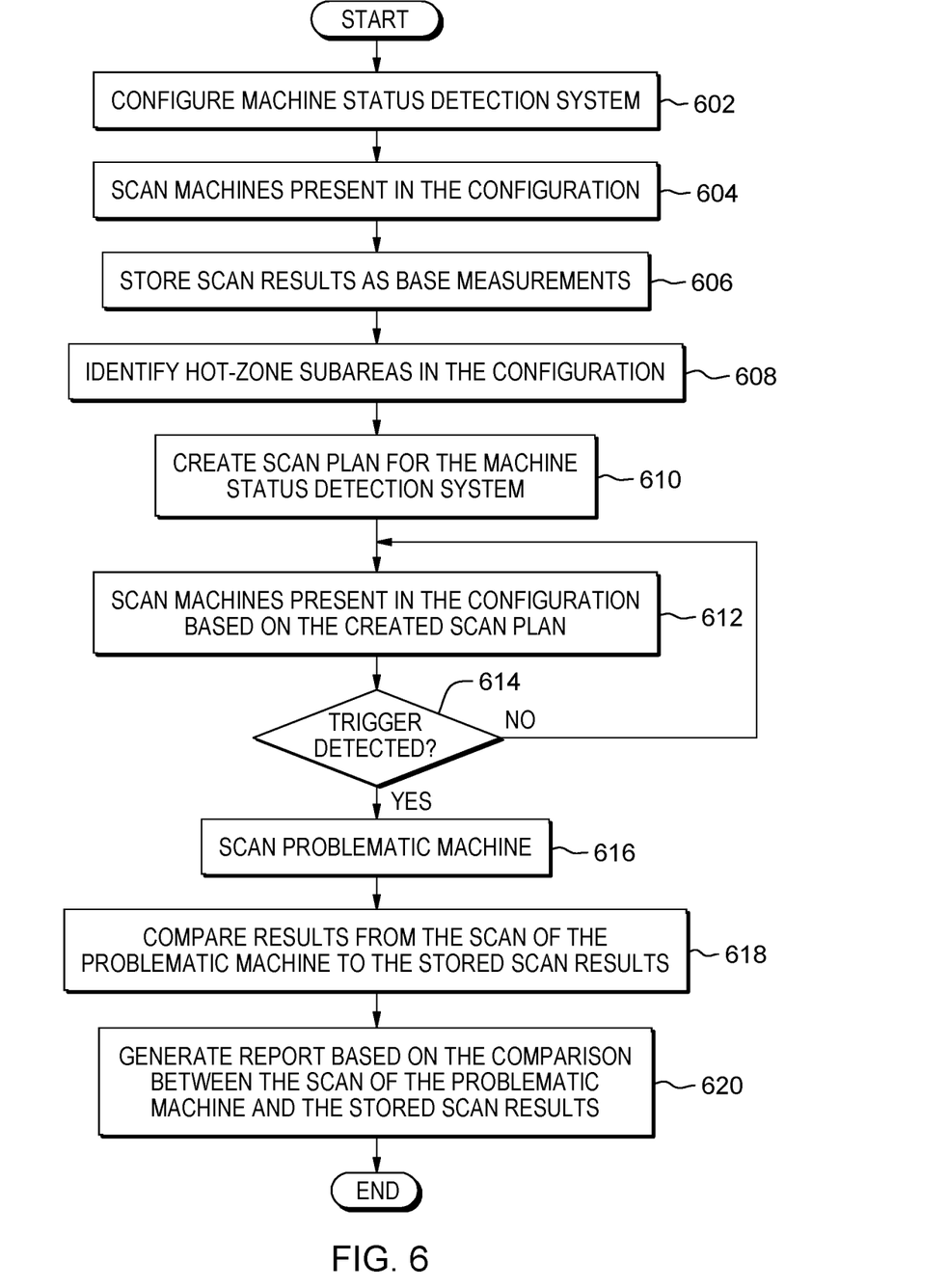
FIG. 6 is a flowchart depicting operational steps of a machine status detection program for monitoring multiple devices on a server rack, in accordance with one embodiment of the present invention.

FIG. 6 is a flowchart depicting operational steps of a machine status detection program for monitoring multiple devices on a server rack, in accordance with one embodiment of the present invention.

Machine status detection program 600 configures a machine status detection system (602). In this embodiment, machine status detection system is attachable sensory assembly 102 with sensory device 108. Machine status detection program 600 configures the machine status detection system based on an orientation and configuration of one or more electronic equipment on a machine rack or housing. Machine status detection program 600 can receive a configuration of machines on the machine rack or housing based on a configuration profile of the one or more electrical equipment as defined by customer requirements. Machine status detection program 600 can receive this configuration profile via an administrative user.

In this embodiment, a machine rack or housing is server rack 104, where electronic components 402 are examples of the one or more electronic equipment. Responsive to machine status detection program 600 determining attachable sensory assembly 102 is coupled to server rack 104, machine status detection program 600 instructs motors 304 and gears 306 coupled to each end of longitudinal structure 110 to travel in both, the −x direction and the +x direction, to determine a width and boundary of travel for longitudinal structure 110. Subsequently, machine status detection program 600 instructs motors 304 and gears 306 coupled to each end of latitudinal structure 112 to travel in both, the −y direction and the +y direction, to determine a height and boundary of travel for longitudinal structure 110. With the width, height, and boundary of travel for both longitudinal structure 110 and latitudinal structure 112, machine status detection program 600 determines an area for scanning machines present in the boundaries of the machine status detection system.

Machine status detection program 600 scans machines present in the configuration (604). In this embodiment, machine status detection program 600 scans the machines in the configuration to establish base measurements for each machine installed on the machine rack or housing. Machine status detection program 600 instructs attachable sensory assembly 102 with sensory device 108 to scan an area bound by a perimeter of gear tracks 302. Sensory device 108 registers readings by the one or more sensors at various points along with the area bound by the gear tracks 302. Based on the received configuration profile previously discussed in (602), machine status detection program 600 associates the registered reading with the one or more sensors with a particular machine installed on the machine rack or housing. Alternatively, machine status detection program 600 can identify a particular machine based on the registered readings from the one or more sensors, without requiring the configuration profile. For example, sensory device 108 can register readings utilizing the one or more sensors that an LCD display panel and a cluster of 6 LEDs are present in a 3×2 orientation, where there is an 8 centimeter spacing between the LCD display panel and the cluster of 6 LEDs in the 3×2 orientation. Machine status program 600 can query a catalog of known machines and identify a machine based on the registered readings from the one or more sensors of sensory device 108.

Machine status detection program 600 stores the scan results as base measurements (606). In this embodiment, machine status detection program 600 stores the scan results from sensory device 108 as base measurements for each machine installed on the machine rack, where the base measurements are utilized by machine status detection program 600 to compare future deviation measurements. Machine status detection program 600 associates a set of scan results with a machine and provides a time stamp for when the base measurements were scanned.

Machine status detection program 600 identifies hot-zone subareas in the configuration (608). In this embodiment, hot-zones are subareas within the scanned area where sensory device 108 of attachable sensory assembly 102 is to prioritize future monitoring. Prioritizing future monitoring can include shortened intervals (e.g., 30 min vs. 60 min) in between scans or a more detailed scan that provides additional information, where machine status detection program 600 instructs sensory device 108 to register readings by the one or more sensors for a predetermined amount of time (e.g., 60 minutes). For example, if sensory device 108 includes 10 different sensors for capturing information emitted, transmitted, or conveyed by the machines on the machine rack, sensory device 108 can register readings from all 10 sensors in the hot-zone areas and register only 3 sensor readings in the remaining area, not designated as a hot-zone area. In alternative embodiments, hot-zone areas in the configuration are defined by customer requirements as agreed upon in a service provider contractor.

Machine status detection program 600 creates a scan plan for the machine status detection system (610). In this embodiment, machine status detection program 600 creates the scan plan for the machine status detection system based on an orientation and configuration of the one or more machines on the machine rack, along with the hot-zone areas in the configuration identified in (608). Machine status detection program 600 utilizes the scan plan to instruct sensory device 108 of attachable sensory assembly 102 to scan machines present in the configuration. The scan plan is updatable based on alterations provided by an administrative user of machine status detection program 600. Alternatively, machine status detection program 600 has self-learning abilities based on life-cycles of every machine presents in the configuration. For example, if a single machine present in the configuration begins to experience a performance degradation, machine status detection program 600 alters the scan plan by designating the single machine experiencing the performance degradation as a hot-zone area. As a result, machine status detection program 600 can prioritize the scanning of this single machine experiencing the performance degradation in manner previously discussed in (608).

Machine status detection program 600 scans machines present in the configuration based on the created scan plan (612). In this embodiment, machine status detection program 600 utilizes a time trigger interval to scan machines present in the configuration based on the created scan plan. The time interval trigger can be an hourly interval or a daily interval for machine status detection program 600 instructing sensory device 108 to scan the machines present in the configuration. Alternatively, machine status detection program 600 has the ability to determine a time interval of high system utilization (e.g., 12 pm-1 pm) and another time interval of low system utilization (e.g., 2 am-3 am), where the time interval of high system utilization and the other time interval of low system utilization are established as the time trigger intervals for scanning machines present in the configuration. In another embodiment, machine status detection program 600 utilizes an issue detection trigger to scan machines present in the configuration based on the created scan plan. For example, if machine status detection program 600 receives an alert from a secondary program associated with a machine or directly from the machine experiencing the issue, machine status detection program 600 utilizes the alert as the issued detection trigger for instructing sensory device 108 to scan the machines present in the configuration. In yet another embodiment, machine status detection program 600 utilizes a manual trigger based on an administrative user input to scan machines present in the configuration based on the created scan plan.

Machine status detection program 600 determines whether a trigger has been detected (614). In the event, machine status detection program 600 determines a trigger has been detected ("yes" branch, 614), machine status detection program 600 scans the problematic machine (616). In the event, machine status detection program 600 determines a trigger has not been detected ("no" branch, 614), machine status detection program 600 reverts and scans machines present in the configuration based on the created scan plan (612). A trigger includes but is not limited to a machine failure, a machine error, or an alarm generated by a machine.

Machine status detection program 600 scans the problematic machine (616). In this embodiment, machine status detection program 600 scans the problematic machines in the configuration to register readings and establish the registered readings as the problematic measurements to which machine status detection program 600 is to compare to the base measurements scanned in (604). Machine status detection program 600 instructs attachable sensory assembly 102 with sensory device 108 to scan a sub-area where the problematic machine is located on the machine rack. Sensory device 108 registers readings by the one or more sensors at various points along with the sub-area for the problematic machine. Machine status detection program 600 associates the registered reading with the one or more sensors with the problematic machine installed on the machine rack and stores the scan results for the problematic machine.

Machine status detection program 600 compares results from the scan of the problematic machine to the stored scan results (618). In this embodiment, machine status detection program 600 compares the scan results from the problematic machine to the stored scan results that include the base measurements. Machine status detection program 600 compares any deviations between the scan results from the problematic machine and the stored scan results that include the base measurements.

Machine status detection program 600 generates a report based on the comparison between the scan of the problematic machine and the stored scan results (620). Machine status detection program 600 generates the report listing the various deviations that are present between the scan results from the problematic machine and the stored scan results that include the base measurements. Machine status detection program 600 utilizes various thresholds for each registered reading of the scan results to determine if a particular deviation is in an acceptable or an unacceptable range. For every deviation that machine status detection program 600 deems to be in an unacceptable range, machine status detection program 600 flags the registered reading from the scan results from the problematic machine and the registered reading from the stored scan with the base measurement. By flagging the registered readings, machine status detection program 600 highlights those readings in the generated report and includes additional information as to why machine status detection program 600 identified the flagged registered readings as being in an unacceptable range. Machine status detection program 600 generates the report and can send the report to an administrative user via an integrated computing device on the machine rack or an automated monitoring system for the server rack.

In alternative embodiments, machine status detection program 600 utilizes the attachable sensory assembly 102 with sensory device 108 as a means of preventing damage to machines located on the machine rack to which attachable sensory assembly 102 is coupled to. In addition to generating a report based on the comparison between the scan of the problematic machine and the stored scan results, machine status detection program 600 has the ability to instruct the problematic machine to shutdown or revert to an idle state, where further damage to the problematic machine can be prevented. The present invention improves on current machine monitoring programs by utilizing an independent attachable sensory assembly 102 and sensory device 108 with machine status detection program 600 that allows for an additional means of protecting machines on the machine rack, where sensory assembly 102 and sensory device 108 with machine status detection program 600 can be on-site accessible by an administrative user and not connected to an external network that is accessible by foreign entities.

Figure 7:
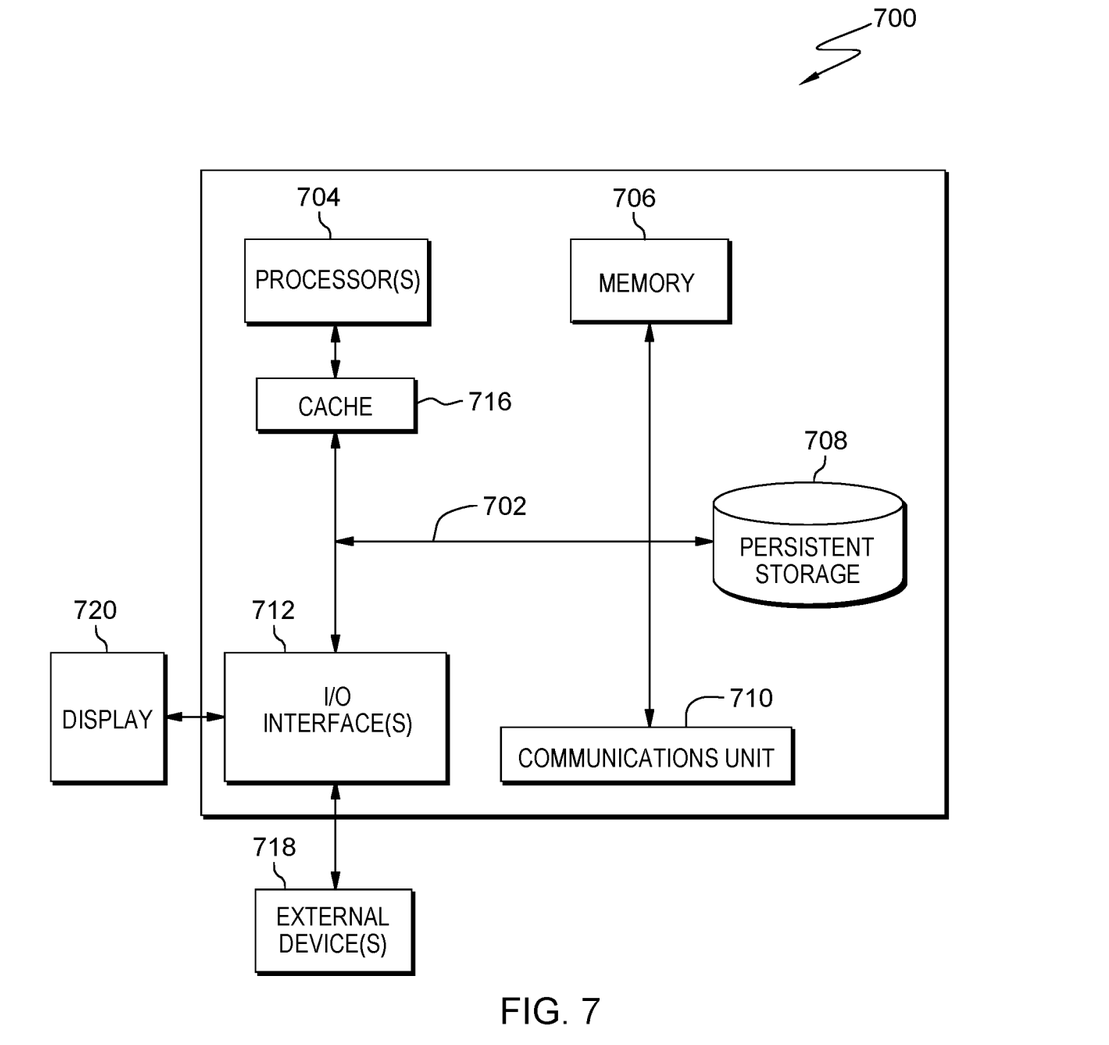
FIG. 7 depicts a block diagram of components of a computer system for performing the operational steps of the machine status detection program, in an embodiment, in accordance with the present invention.

FIG. 7 depicts a block diagram of components of a computer system for performing the operational steps of the machine status detection program, in an embodiment, in accordance with the present invention. Computer system 700, where embedded microcontroller 704 is an example of a system that includes battery cell containment program 700. The computer system includes processors 704, cache 716, memory 706, persistent storage 708, communications unit 710, input/output (I/O) interface(s) 712 and communications fabric 702. Communications fabric 702 provides communications between cache 716, memory 706, persistent storage 708, communications unit 710, and input/output (I/O) interface(s) 712. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses or a crossbar switch.

Memory 706 and persistent storage 708 are computer readable storage media. In this embodiment, memory 702 includes random access memory (RAM). In general, memory 706 can include any suitable volatile or non-volatile computer readable storage media. Cache 716 is a fast memory that enhances the performance of processors 704 by holding recently accessed data, and data near recently accessed data, from memory 706.

Program instructions and data used to practice embodiments of the present invention may be stored in persistent storage 708 and in memory 706 for execution by one or more of the respective processors 704 via cache 716. In an embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices. In these examples, communications unit 710 includes one or more network interface cards. Communications unit 710 may provide communications through the use of either or both physical and wireless communications links. Program instructions and data used to practice embodiments of the present invention may be downloaded to persistent storage 708 through communications unit 710.

I/O interface(s) 712 allows for input and output of data with other devices that may be connected to each computer system. For example, I/O interface 706 may provide a connection to external devices 718 such as a keyboard, keypad, a touch screen, and/or some other suitable input device. External devices 718 can also include portable computer readable storage media such as, for example, thumb drives, portable optical or magnetic disks, and memory cards. Software and data used to practice embodiments of the present invention can be stored on such portable computer readable storage media and can be loaded onto persistent storage 708 via I/O interface(s) 712. I/O interface(s) 712 also connect to display 720.

Display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus for an attachable sensory assembly, the apparatus comprising:
   a plurality of gear tracks, a sensory device, a first structure, and a second structure;
   the sensory device suspended by the first structure and the second structure, wherein the sensory device is moveable along a length of the first structure and a length of the second structure;
   a first end and a second end of the first structure are each disposed on a first portion of the plurality of gear tracks, wherein the first portion of the plurality of gear tracks guide the first end and the second end of the first structure; and
   a first end and a second end of the second structure are each disposed on a second portion the plurality of gear tracks, wherein the second portion of the plurality of gear tracks guide the first end and the second end of the second structure.

2. The apparatus of claim 1, further comprising:
   the first end of the first structure disposed on a first gear track of the first portion of the plurality of gear tracks;
   the second end of the first structure disposed on a second gear track of the first portion of the plurality of gear tracks, wherein the first gear track and the second gear of the first portion of the plurality of gear tracks are in parallel.

3. The apparatus of claim 2, further comprising:
   the first end of the second structure disposed on a first gear track of the second portion of the plurality of gear tracks;
   the second end of the second structure disposed on a second gear track of the second portion of the plurality of gear tracks, wherein the first gear track and the second gear track of the second portion of the plurality of gear tracks are in parallel.

4. The apparatus of claim 3, wherein the first portion of the plurality of gear tracks are perpendicular to the second portion of the plurality of gear tracks.

5. The apparatus of claim 3, further comprising:
   a first motor coupled to a first gear, wherein the first motor provides a rotational force to the first gear;
   a second motor coupled to a second gear, wherein the second motor provides a rotational force to the second gear;
   the first motor coupled to the first end of the second structure, wherein the first gear is disposed on the first gear track of the second portion of the plurality of gear tracks; and
   the second motor coupled to the second end of the second structure, wherein the second gear is disposed on the second gear track of the second portion of the plurality of gear tracks.

6. The apparatus of claim 2, further comprising:
   a first motor coupled to a first gear, wherein the first motor provides a rotational force to the first gear;
   a second motor coupled to a second gear, wherein the second motor provides a rotational force to the second gear;
   the first motor coupled to the first end of the first structure, wherein the first gear is disposed on the first gear track of the first portion of the plurality of gear tracks; and
   the second motor coupled to the second end of the first structure, wherein the second gear is disposed on the second gear track of the first portion of the plurality of gear tracks.

7. The apparatus of claim 1, wherein the sensory device includes one or more electronic devices selected from the group consisting of a visible light still camera, an infrared still camera, and an infrared video camera.

8. The apparatus of claim 1, wherein the sensory device includes one or more sensors selected from the group consisting of a light sensor, a sound sensor, a proximity sensor, an accelerometer, an infrared sensor, a pressure sensor, an ultrasonic sensor, a smoke sensor, and a temperature sensor.

9. The apparatus of claim 1, wherein the first structure is perpendicular to the second structure.

10. The apparatus of claim 9, wherein the first structure is longitudinally disposed between the first portion of the plurality of gear tracks.

11. The apparatus of claim 10, wherein the second structure is longitudinally disposed between the second portion of the plurality of gear tracks.

12. The apparatus of claim 11, wherein the first structure is a first rod and the second structure is a second rod.

13. The apparatus of claim 11, wherein the first structure is a first cable wire and the second structure is a second cable wire.

14. The apparatus of claim 1, wherein the plurality of tracks are coupled to a surface of a machine rack.

15. The apparatus of claim 14, further comprising:
    a first gear track of the first portion of the plurality of gear track coupled to a first side of the surface of the machine rack; and
    a second gear track of the first portion of the plurality of gear track coupled to a second side of the surface of the machine rack, wherein the first side of the surface of the machine rack is parallel to the second side of the machine rack.

16. The apparatus of claim 15, further comprising:
    a first gear track of the second portion of the plurality of gear track coupled to a third side of the surface of the machine rack; and
    a second gear track of the first portion of the plurality of gear track coupled to a forth side of the surface of the machine rack, wherein the third side of the surface of the machine rack is parallel to the fourth side of the machine rack.

17. The apparatus of claim 16, wherein the first side and the second side of the machine rack are perpendicular to the third and the fourth side of the machine rack.

* * * * *